US012689329B2

(12) United States Patent
Tang et al.

(10) Patent No.: US 12,689,329 B2
(45) Date of Patent: Jul. 21, 2026

(54) LOW VOLTAGE FLOATING INVERTER AMPLIFIER (LVFIA) AND SWITCHED CAPACITOR ANALOG-TO-DIGITAL CONVERTER (ADC)

(71) Applicant: HANGZHOU VANGO TECHNOLOGIES, INC., Hangzhou (CN)

(72) Inventors: Zhong Tang, Hangzhou (CN); Xinjie Wu, Hangzhou (CN); Xiaopeng Yu, Hangzhou (CN)

(73) Assignee: HANGZHOU VANGO TECHNOLOGIES, INC., Hangzhou (CN)

( * ) Notice: Subject to any disclaimer, the term of this patent is extended or adjusted under 35 U.S.C. 154(b) by 228 days.

(21) Appl. No.: 18/730,308

(22) PCT Filed: Nov. 30, 2023

(86) PCT No.: PCT/CN2023/135360
§ 371 (c)(1),
(2) Date: Jul. 19, 2024

(87) PCT Pub. No.: WO2025/025440
PCT Pub. Date: Feb. 6, 2025

(65) Prior Publication Data
US 2026/0196969 A1 Jul. 9, 2026

(30) Foreign Application Priority Data

Aug. 1, 2023 (CN) ......................... 202310955162.X

(51) Int. Cl.
| | |
|---|---|
| *H03M 1/12* | (2006.01) |
| *H03F 1/02* | (2006.01) |
| *H03F 3/04* | (2006.01) |

(52) U.S. Cl.
CPC ............. *H03F 1/0216* (2013.01); *H03F 3/04* (2013.01); *H03M 1/12* (2013.01)

(58) Field of Classification Search
CPC . H03F 1/0216; H03F 3/04; H03F 1/32; H03F 1/26; H03F 3/005; H03F 1/12; H03M 1/466; H03M 1/403
USPC ......................... 341/143, 155, 144, 150, 172
See application file for complete search history.

(56) References Cited

U.S. PATENT DOCUMENTS

2019/0319596 A1 * 10/2019 Chen ..................... H03L 7/0818

OTHER PUBLICATIONS

Xiyuan Tang et al., "An Energy-Efficient Comparator with Dynamic Floating Inverter Pre-Amplifier", IEEE J. Solid-State Circuits, vol. 55, No. 4, pp. 1011-1022, Apr. 2020.

* cited by examiner

*Primary Examiner* — Peguy Jean Pierre

(57) ABSTRACT

Provided are a low voltage floating inverter amplifier (LV-FIA) and a switched capacitor analog-to-digital converter (ADC). The LVFIA includes a first self-biased inverter, a second self-biased inverter, and an energy-storage capacitor that are connected in parallel. The first and second self-biased inverters are clock-controlled inverters that generate a bias voltage. The parallel connection has one end connected to a supply voltage through a reset switch and the other end connected to a grounding voltage through a reset switch. An input terminal and an input terminal of the second self-biased inverter are connected to an input signal and to the grounding voltage through a reset switch. An output terminal and an output terminal of the second self-biased inverter are equipped with an amplification switch. The reset switch and the amplification switch are alternately closed. The LVFIA achieves compatibility with sub-1V power supply, reducing a power consumption and improving energy efficiency.

16 Claims, 5 Drawing Sheets

LOW VOLTAGE FLOATING INVERTER AMPLIFIER (LVFIA) AND SWITCHED CAPACITOR ANALOG-TO-DIGITAL CONVERTER (ADC)

TECHNICAL FIELD

The present disclosure relates to the technical field of analog circuits, and in particular, to a low voltage floating inverter amplifier (LVFIA) and a switched capacitor analog-to-digital converter (ADC).

BACKGROUND

A low-power sensor chip is required in an Internet of Things (IOT) application scenario to extend a battery life. An effective method to achieve a low power consumption is to reduce a voltage of a power supply of the chip. How to implement a chip compatible with a sub-1V power supply is of great significance. However, in the case of the sub-1V power supply, a difficulty in designing an analog circuit also greatly increases. As a most basic analog circuit module, an amplifier is applied widely. However, in the case of the sub-1V power supply, a complex amplifier is hard to design, and a simple structure is preferred. As shown in FIG. 1, as a structurally simple dynamic amplifier, a floating inverter amplifier (FIA) has many advantages: No static power consumption is required, thus achieving high energy efficiency; a bandwidth and a power consumption can be adjusted with a working frequency; and an output common mode is stable, and there is no need for an additional common-mode feedback circuit, and the like. However, existing FIAs are unable to adapt to a sub-1V power supply scenario.

Term Explanation

Sub-1V: lower than 1V
FIA: floating inverter amplifier
LVFIA: low voltage FIA

SUMMARY

An objective of the present disclosure: A technical problem to be resolved in the present disclosure is to provide an LVFIA and a switched capacitor ADC in response to shortcomings in the prior art.

In order to resolve the above technical problem, a first aspect of the present disclosure provides an LVFIA, including a first self-biased inverter, a second self-biased inverter, and an energy-storage capacitor $C_{RES}$, where both the first self-biased inverter and the second self-biased inverter are clock-controlled inverters capable of generating a bias voltage; and the first self-biased inverter, the second self-biased inverter, and the energy-storage capacitor $C_{RES}$ are connected in parallel, one end of the parallel connection is connected to a supply voltage $V_{DD}$ through a reset switch, and the other end of the parallel connection is connected to a grounding voltage $V_{SS}$ through a reset switch.

Both an input terminal of the first self-biased inverter and an input terminal of the second self-biased inverter are connected to an input signal and to the grounding voltage $V_{SS}$ through a reset switch; both an output terminal of the first self-biased inverter and an output terminal of the second self-biased inverter are equipped with an amplification switch to control output of an output signal; and the reset switch and the amplification switch are alternately closed through clock control.

Further, the first self-biased inverter includes a capacitively-biased P-channel metal oxide semiconductor (PMOS) circuit and a capacitively-biased N-channel metal oxide semiconductor (NMOS) circuit, where the capacitively-biased PMOS circuit is connected to the supply voltage $V_{DD}$ through the reset switch, and the capacitively-biased NMOS circuit is connected to the grounding voltage $V_{SS}$ through the reset switch; one end of the capacitively-biased PMOS circuit is connected to one end of the capacitively-biased NMOS circuit, where a connection point is connected to an input voltage and to the grounding voltage $V_{SS}$ through the reset switch, and the other end of the capacitively-biased PMOS circuit is connected to the other end of the capacitively-biased NMOS circuit through the amplification switch; and the second self-biased inverter and the first self-biased inverter are mirrored.

Further, the capacitively-biased PMOS circuit includes a first auto-zeroing capacitor $C_{C1}$ and a PMOS transistor, where the first auto-zeroing capacitor $C_{C1}$ is connected to a gate of the PMOS transistor, with a connection point provided with a first charging switch and a first bias switch, the first charging switch is connected to the grounding voltage $V_{SS}$, and the first bias switch is connected to a drain of the PMOS transistor; a source of the PMOS transistor is connected to a source of a PMOS transistor of the second self-biased inverter, with a connection point separately connected to the energy-storage capacitor $C_{RES}$ and the reset switch; and the first charging switch and the first bias switch are alternately closed through the clock control.

Further, the capacitively-biased NMOS circuit includes a second auto-zeroing capacitor $C_{C2}$ and an NMOS transistor, where the second auto-zeroing capacitor $C_{C2}$ is connected to a gate of the NMOS transistor, with a connection point provided with a second charging switch and a second bias switch, the second charging switch is connected to the supply voltage $V_{DD}$, and the second bias switch is connected to a drain of the NMOS transistor; a source of the NMOS transistor is connected to a source of an NMOS transistor of the second self-biased inverter, with a connection point separately connected to the energy-storage capacitor $C_{RES}$ and the reset switch; and the second charging switch and the second bias switch are alternately closed through the clock control.

The first auto-zeroing capacitor $C_{C1}$ is connected to the second auto-zeroing capacitor $C_{C2}$, with a connection point connected to the input voltage and to the grounding voltage $V_{SS}$ through the reset switch; and the drain of the PMOS transistor and the drain of the NMOS transistor are connected through the amplification switch.

Further, a clock control timing sequence includes a reset phase $\Phi_{RST}$ and an amplification phase $\Phi_{EN}$, and the reset phase $\Phi_{RST}$ includes a capacitor charging phase $\Phi_1$ and a bias voltage generation phase $\Phi_2$, where all reset switches are closed in the reset phase $\Phi_{RST}$ to form a path, and are opened in the amplification phase $\Phi_{EN}$; all charging switches are closed in the capacitor charging phase $\Phi_1$ to form a path, and are opened in other phases; all bias switches are closed in the bias voltage generation phase $\Phi_2$ to form a path, and opened in other phases; and all amplification switches are closed in the amplification phase $\Phi_{EN}$ to form a path, and opened in the reset phase $\Phi_{RST}$.

Further, in the bias voltage generation phase $\Phi_2$, all auto-zeroing capacitors are discharged, and a target bias voltage is obtained by controlling high-level time in the bias voltage generation phase $\Phi_2$; and the PMOS transistor and the NMOS transistor each achieve auto-zeroing to eliminate an offset voltage and 1/f noise.

Further, in the bias voltage generation phase $\Phi_2$, a magnitude of a bias voltage generated by the discharging of all the auto-zeroing capacitors is related to the high-level time in the $\Phi_2$ and a capacitance value of the auto-zeroing capacitor, where longer high-level time in the $\Phi_2$ leads to more electricity discharged by the auto-zeroing capacitor and a greater change of the generated bias voltage; and a larger capacitance value of the auto-zeroing capacitor leads to slower charging and a slower change of the bias voltage.

A second aspect provides a switched capacitor ADC, including the LVFIA described above.

Further, the switched capacitor ADC is a $\Sigma\Delta$ ADC. The $\Sigma\Delta$ ADC includes a second-order one-bit $\Sigma\Delta$ modulator. The second-order one-bit $\Sigma\Delta$ modulator includes a first-stage integrator, a second-stage integrator, and a comparator, and both the first-stage integrator and the second-stage integrator include the LVFIA.

Further, the second-order one-bit $\Sigma\Delta$ modulator includes a pair of non-overlapping clocks $\Phi_A$ and $\Phi_B$, and the non-overlapping clocks $\Phi_A$ and $\Phi_B$ are configured to control sampling and integration of the first-stage integrator and the second-stage integrator, and are also input into the LVFIA as reset and amplification clocks in the LVFIA; the reset clock of the LVFIA in the first-stage integrator includes sub-clocks $\Phi_1$ and $\Phi_2$ that are respectively a capacitor charging phase and a bias voltage generation phase; and the reset clock of the LVFIA in the second-stage integrator includes sub-clock $\Phi'_1$ and $\Phi'_2$ that are respectively a capacitor charging phase and a bias voltage generation phase.

Beneficial effects: An FIA compatible with a sub-1V power supply is achieved at a low cost, thereby reducing a power consumption and improving energy efficiency. Specific beneficial effects are as follows:

1) Capacitor charging and diode discharging are combined in the present disclosure. Therefore, a PMOS and an NMOS can be freely biased based on a threshold voltage of a metal oxide semiconductor (MOS) transistor, improving flexibility and reducing a lowest supply voltage.

2) In the present disclosure, the PMOS and the NMOS are independently used for auto-zeroing and discharging. There is no current path between the PMOS and the NMOS, and the PMOS and the NMOS do not interfere with each other, further reducing a power supply demand.

3) An auto-zeroing technology is adopted to reduce an offset voltage and 1/f noise, and auto-zeroing itself requires an auto-zeroing capacitor and a diode-connected MOS transistor. Therefore, the present disclosure uses the auto-zeroing capacitor and the diode-connected MOS transistor to constitute a discharging path to determine a bias voltage, without a need for an additional energy-storage capacitor, floating current source capacitor, and MOS transistor, thereby reducing a hardware consumption and achieving a simple circuit and timing sequence.

The LVFIA can be applied to common analog integrated circuits, including but not limited to a switched capacitor ADC, a comparator, and the like. A circuit using the LVFIA can work at a lower supply voltage, thereby achieving a low power consumption.

BRIEF DESCRIPTION OF THE DRAWINGS

The present disclosure will be further described below with reference to accompanying drawings and specific implementations. The advantages of the above and/or other aspects of the present disclosure will become clearer.

DETAILED DESCRIPTION

The embodiments of the present disclosure will be described below with reference to the accompanying drawings.

Figure 1:
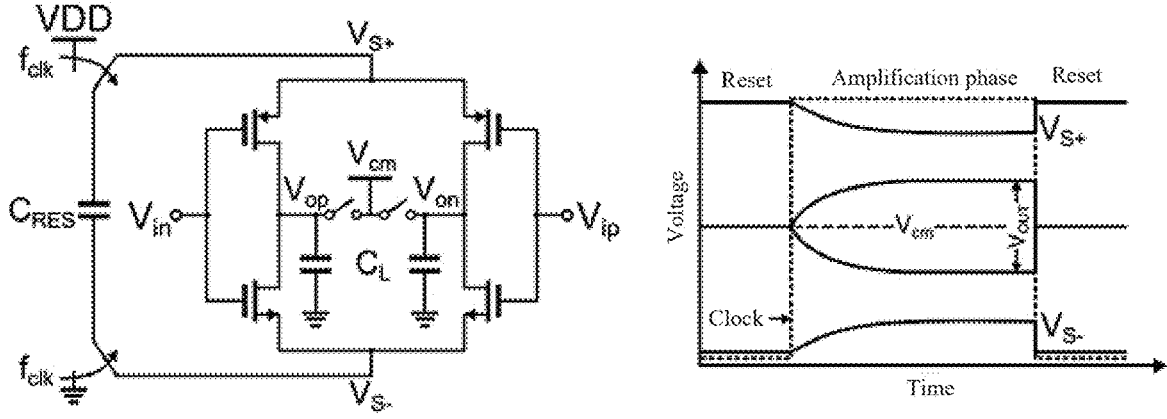
FIG. 1 shows a circuit topology of an FIA and a change of a related working voltage.

As a structurally simple dynamic amplifier, an FIA has many advantages: No static power consumption is required, thus achieving high energy efficiency; a bandwidth and a power consumption can be adjusted with a working frequency; and an output common mode is stable, and there is no need for an additional common-mode feedback circuit, and the like. FIG. 1 shows a circuit topology of the FIA and a change of a working voltage of the FIA.

The FIA works in two phases: a reset phase and an amplification phase. In the reset phase, $C_{RES}$ is charged, and an operational amplifier outputs $V_{OP}$ and $V_{ON}$ that are set as $V_{CM}$ (a common-mode voltage output by the FIA). In the amplification phase, the $C_{RES}$ powers a right amplification circuit, and the amplification circuit performs amplification. $V_{S+}$ and $V_{S-}$ approach the $V_{CM}$. Until an amplification transistor is basically cut off, the amplification ends, and the $V_{S+}$, the $V_{S-}$, and an output no longer change.

Figure 2:
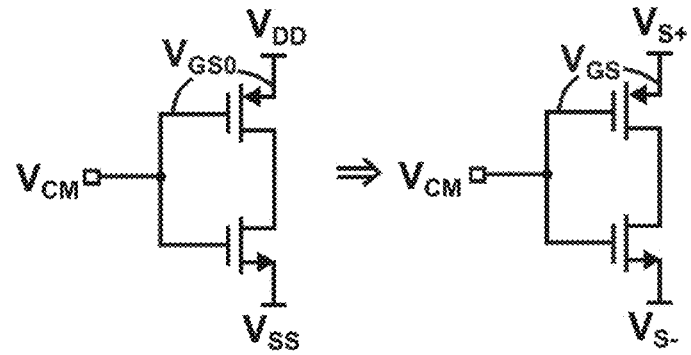
FIG. 2 schematically shows a change of Vos of a PMOS transistor in an amplification phase.

However, the FIA cannot work under a sub-1V power supply for following reasons: It is assumed that the common-mode voltage at an input terminal of the FIA is $V_{CM}=V_{DD}/2$, at the beginning of the amplification phase, a difference between a gate voltage and a source voltage on a PMOS transistor is recorded as $V_{GS0}$, and as the amplification proceeds, the difference between the gate voltage and the source voltage gradually changes and is recorded as $V_{GS}$, as shown in FIG. 2. 1) If $V_{GS0}>|V_{THP}|$, where the $V_{THP}$ represents a threshold voltage of the PMOS transistor, as the amplification proceeds, when $V_{S+}<V_{CM}+|V_{THP}|$ and $V_{S-}>V_{CM}-V_{THN}$, the amplification transistor is cut off. Therefore, an output swing of the FIA is limited within $|V_{THP}|+V_{THN}$, where the $V_{THN}$ represents a threshold voltage of an NMOS transistor. 2) If $V_{GS0}<|V_{THP}|$, the amplification transistor is already in a cut-off state at the beginning of the amplification phase, and the FIA cannot work properly. However, under the sub-1V power supply, it is difficult for the $V_{DD}/2$ to exceed a threshold voltage VTH of a MOS transistor, so a traditional FIA faces a dilemma of not being able to work.

Reference: [1] X. Tang et al., "An energy-efficient comparator with dynamic floating inverter amplifier," IEEE J. Solid-State Circuits, vol. 55, no. 4, pp. 1011-122 April 2020.

Traditional FIA: Because a PMOS and an NMOS are biased at a same bias voltage, and the difference between the gate voltage and the source voltage, in other words, the $V_{gs}$, of the amplification transistor is less than the VTH under the sub-1V power supply, and the amplification transistor is cut off, the FIA cannot work properly.

An objective of the embodiments of the present disclosure is to achieve an FIA compatible with the sub-1V power supply at a low cost, thereby reducing a power consumption and improving energy efficiency.

Figure 3:
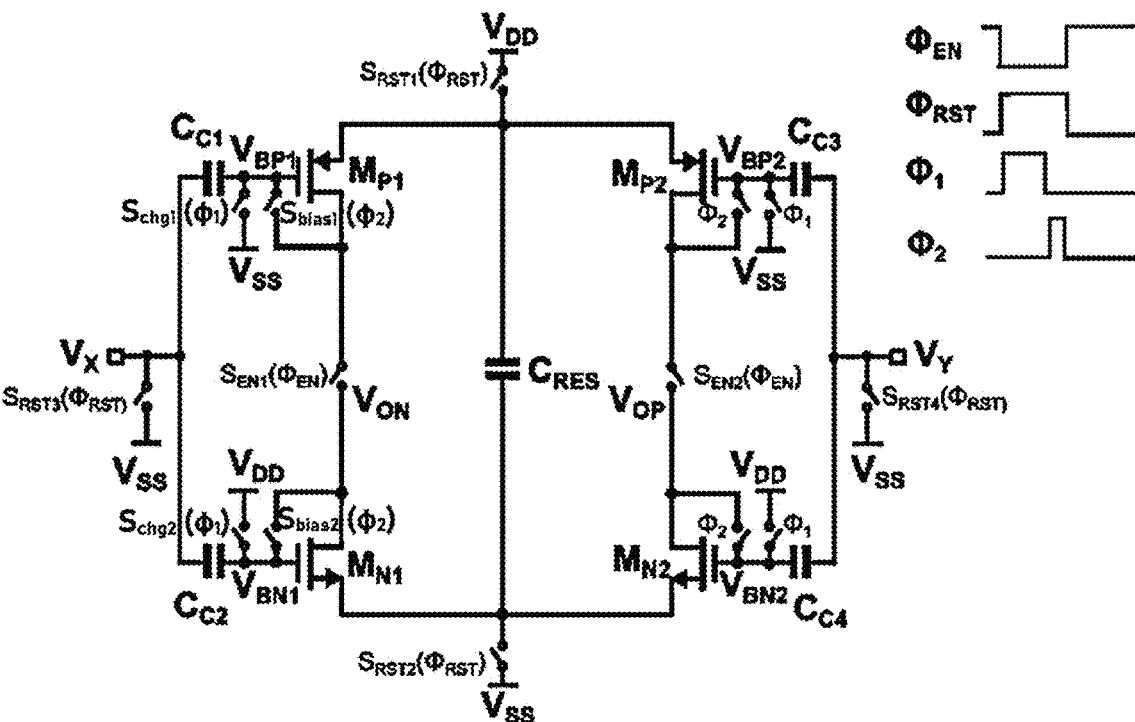
FIG. 3 is a schematic diagram of a circuit of an LVFIA according to an embodiment of the present disclosure.

A first embodiment of the present disclosure provides an LVFIA suitable for low-voltage power supply. FIG. 3 shows a circuit topology of the LVFIA. The LVFIA includes a first self-biased inverter, a second self-biased inverter, and an energy-storage capacitor $C_{RES}$. Both the first self-biased inverter and the second self-biased inverter are clock-controlled inverters capable of generating a bias voltage. The first self-biased inverter, the second self-biased inverter, and the energy-storage capacitor $C_{RES}$ are connected in parallel, where one end of the parallel connection is connected to a supply voltage $V_{DD}$ through a reset switch $S_{RST1}$, and the other end of the parallel connection is connected to a grounding voltage $V_{SS}$ through a reset switch $S_{RST2}$.

Both an input terminal of the first self-biased inverter and an input terminal of the second self-biased inverter are connected to an input signal and to the grounding voltage $V_{SS}$ through reset switches $S_{RST3}$ and $S_{RST4}$, respectively. Both an output terminal of the first self-biased inverter and an output terminal of the second self-biased inverter are equipped with amplification switches $S_{EN1}$ and $S_{EN2}$ to control output of an output signal. The reset switches $S_{RST1}$, $S_{RST2}$, $S_{RST3}$, and $S_{RST4}$, and the amplification switches $S_{EN1}$ and $S_{EN2}$ are alternately closed through clock control. In a specific implementation process, the reset switches $S_{RST1}$, $S_{RST2}$, $S_{RST3}$, and $S_{RST4}$, and the amplification switches $S_{EN1}$ and $S_{EN2}$ each may be a PMOS switch, an NMOS switch, or a complementary metal oxide semiconductor (CMOS) switch. The energy-storage capacitor $C_{RES}$ may be a metal-insulator-metal (MIM) capacitor, a metal-oxide-metal (MOM) capacitor, or a MOS capacitor.

The first self-biased inverter includes a capacitively-biased PMOS circuit and a capacitively-biased NMOS circuit. The capacitively-biased PMOS circuit is connected to the supply voltage $V_{DD}$ through the reset switch $S_{RST1}$, and the capacitively-biased NMOS circuit is connected to the grounding voltage $V_{SS}$ through the reset switch $S_{RST2}$. One end of the capacitively-biased PMOS circuit is connected to one end of the capacitively-biased NMOS circuit, where a connection point is connected to an input voltage and to the grounding voltage $V_{SS}$ connected through the reset switch $S_{RST3}$, and the other end of the capacitively-biased PMOS circuit is connected to the other end of the capacitively-biased NMOS circuit through the amplification switch $S_{EN1}$. The second self-biased inverter and the first self-biased inverter are mirrored.

The capacitively-biased PMOS circuit includes a first auto-zeroing capacitor $C_{C1}$ and a PMOS transistor $M_{P1}$. The first auto-zeroing capacitor $C_{C1}$ is connected to a gate of the PMOS transistor $M_{P1}$, with a connection point provided with a first charging switch $S_{chg1}$ and a first bias switch $S_{bias1}$. The first charging switch $S_{chg1}$ is connected to the grounding voltage $V_{SS}$, and the first bias switch $S_{bias1}$ is connected to a drain of the PMOS transistor $M_{P1}$. A source of the PMOS transistor $M_{P1}$ is connected to a source of a PMOS transistor $M_{P2}$ of the second self-biased inverter, with a connection point separately connected to the energy-storage capacitor $C_{RES}$ and the reset switch $S_{RST1}$. The first charging switch $S_{chg1}$ and the first bias switch $S_{bias1}$ are alternately closed through the clock control. In a specific implementation process, the first charging switch $S_{chg1}$ may be the NMOS or CMOS switch, the first bias switch $S_{bias1}$ may be the PMOS, NMOS, or CMOS switch, and the first auto-zeroing capacitor $C_{C1}$ may be the MIM capacitor or the MOM capacitor.

The capacitively-biased NMOS circuit includes a second auto-zeroing capacitor $C_{C2}$ and an NMOS transistor $M_{N1}$. The second auto-zeroing capacitor $C_{C2}$ is connected to a gate of the NMOS transistor $M_{N1}$, with a connection point provided with a second charging switch $S_{chg2}$ and a second bias switch $S_{bias2}$. The second charging switch $S_{chg2}$ is connected to the supply voltage $V_{DD}$, and the second bias switch $S_{bias2}$ is connected to a drain of the NMOS transistor $M_{N1}$. A source of the NMOS transistor $M_{N1}$ is connected to a source of an NMOS transistor $M_{N2}$ of the second self-biased inverter, with a connection point separately connected to the energy-storage capacitor $C_{RES}$ and the reset switch $S_{RST2}$. The second charging switch $S_{chg2}$ and the second bias switch $S_{bias2}$ are alternately closed through the clock control. In a specific implementation process, the second charging switch $S_{chg2}$ may be the NMOS or CMOS switch, the second bias switch $S_{bias2}$ may be the PMOS, NMOS, or CMOS switch, and the second auto-zeroing capacitor $C_{C2}$ may be the MIM capacitor or the MOM capacitor.

The first auto-zeroing capacitor $C_{C1}$ is connected to the second auto-zeroing capacitor $C_{C2}$, with a connection point connected to the input voltage and to the grounding voltage $V_{SS}$ through the reset switch $S_{RST3}$; and the drain of the PMOS transistor $M_{P1}$ and the drain of the NMOS transistor $M_{N1}$ are connected through the amplification switch $S_{EN1}$.

The second self-biased inverter and the first self-biased inverter are mirrored. In order to distinguish, for the second self-biased inverter, an auto-zeroing capacitor of the capacitively-biased PMOS circuit is denoted as $C_{C3}$, and an auto-zeroing capacitor of the capacitively-biased NMOS circuit is denoted as $C_{C4}$. The drain of the PMOS transistor $M_{P2}$ and the drain of the NMOS transistor $M_{N2}$ are connected through the amplification switch $S_{EN2}$.

The LVFIA works in two main phases: a reset phase (PRST) and an amplification phase (PEN). The reset phase is further divided into two small phases, which are controlled by sub-clocks $\Phi_1$ and $\Phi_2$ and also known as a capacitor charging phase $\Phi_1$ and a bias voltage generation phase $\Phi_2$. All reset switches are closed in the reset phase $\Phi_{RST}$ to form a path, and are opened in the amplification phase $\Phi_{EN}$. All charging switches are closed in the capacitor charging phase $\Phi_1$ to form a path, and are opened in other phases. All bias switches are closed in the bias voltage generation phase $\Phi_2$ to form a path, and opened in other phases. All amplification switches are closed in the amplification phase $\Phi_{EN}$ to form a path, and opened in the reset phase $\Phi_{RST}$.

The LVFIA works as follows in each phase.

Figure 4:
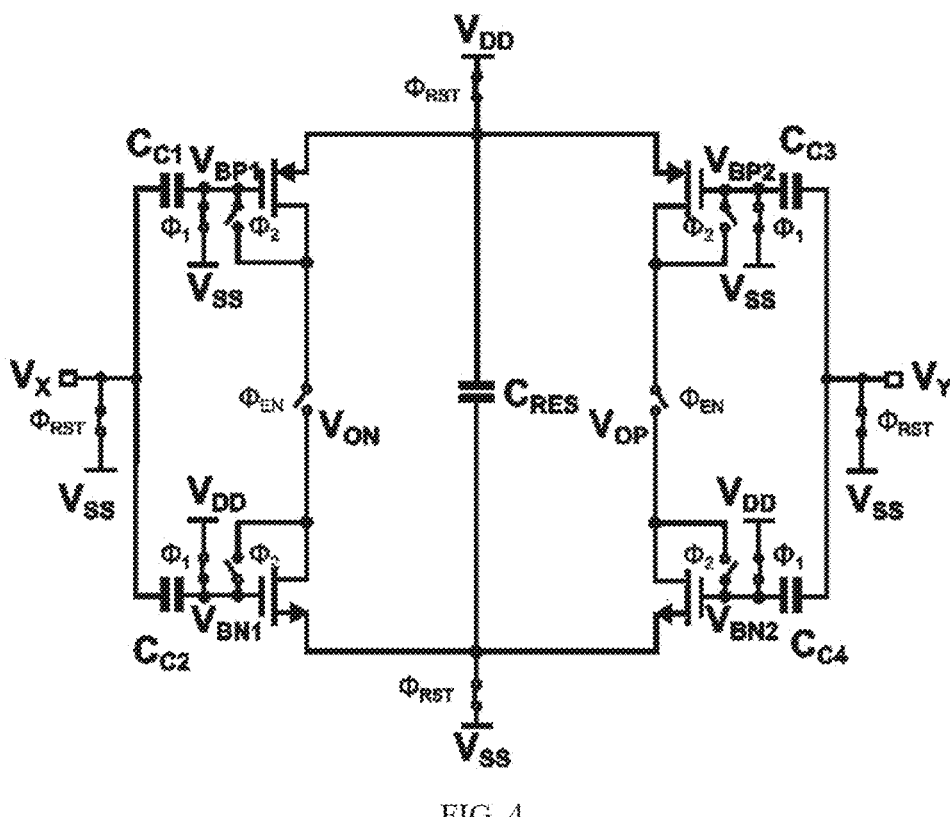
FIG. 4 is a schematic diagram of a circuit of an LVFIA in a capacitor charging phase $\Phi_1$ according to an embodiment of the present disclosure.

1) As shown in FIG. 4, in the capacitor charging phase $\Phi_1$, The energy-storage capacitor $C_{RES}$ and all the auto-zeroing capacitors $C_{C1}$, $C_{C2}$, $C_{C3}$, and $C_{C4}$ are charged.

Drains of amplification transistors (the PMOS transistor and the NMOS transistor) are suspended, and no current path is available.

Figures 5, 6:
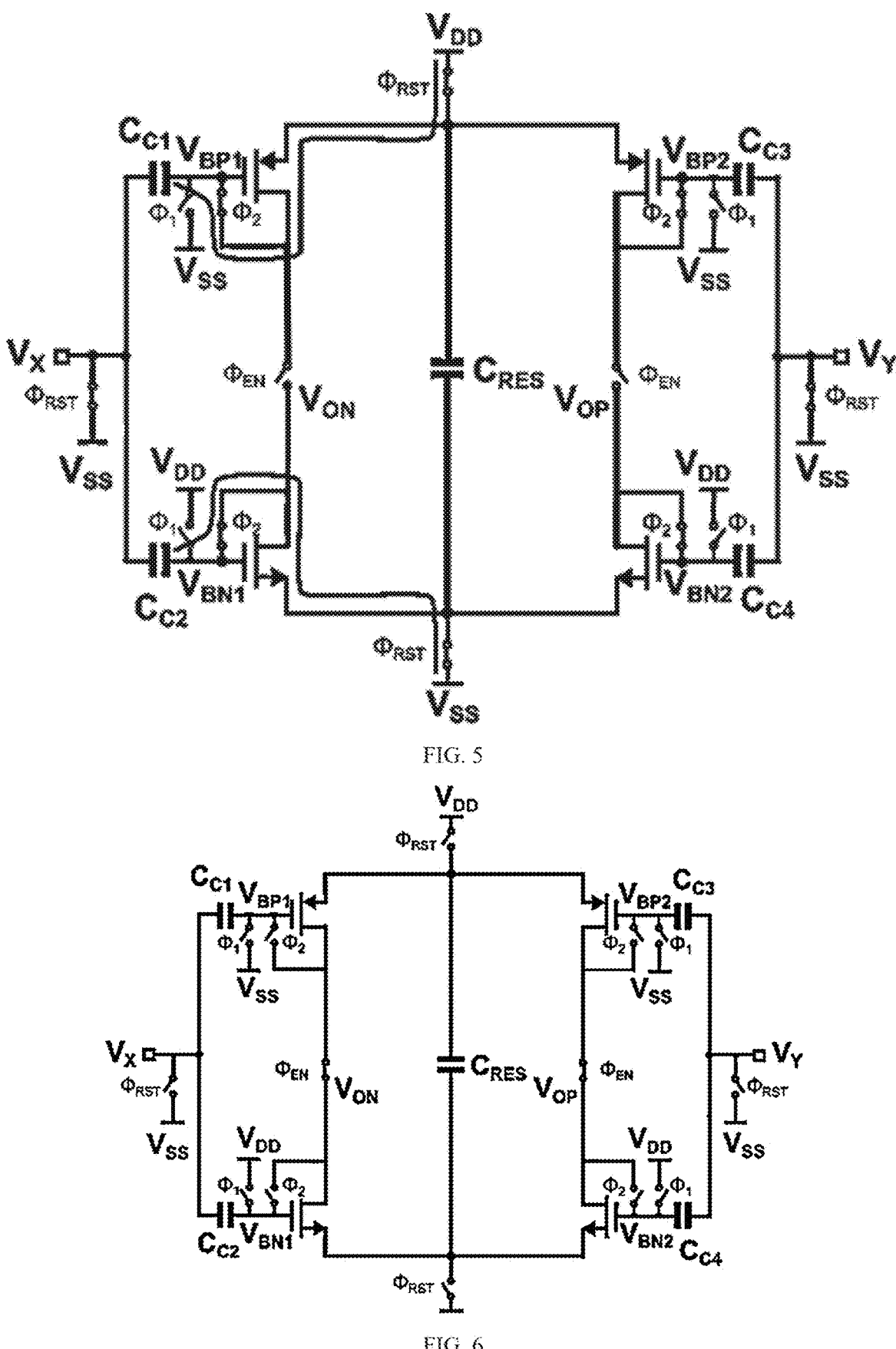
FIG. 5 is a schematic diagram of a circuit of an LVFIA in a bias voltage generation phase $\Phi_2$ according to an embodiment of the present disclosure.
FIG. 6 is a schematic diagram of a circuit of an LVFIA in an amplification phase $\Phi_{EN}$ according to an embodiment of the present disclosure.

2) As shown in FIG. 5, in the bias voltage generation phase $\Phi_2$,

Both the PMOS transistor and the NMOS transistor are diode-connected, in other words, are unit-gain connected. A PMOS and an NMOS each achieve auto-zeroing to eliminate an offset voltage and 1/f noise.

All the auto-zeroing capacitors $C_{C1}$, $C_{C2}$, $C_{C3}$, and $C_{C4}$ are discharged separately through a curvilinear path shown in FIG. 5, and target bias voltages $V_{BP1}$, $V_{BP2}$, $V_{BN1}$, and $V_{BN2}$ are obtained by controlling high-level time in the $\Phi_2$. The bias voltage is related to discharging time (longer high-level time in the $\Phi_2$ leads to more electricity discharged and a greater change of the bias voltage) and a capacitance value of the $C_C$ (a larger capacitance value of the $C_C$ leads to a slower change of the bias voltage), and is irrelevant to an initial voltage to which the $C_C$ is charged in the $\Phi_1$. This reflects robustness that a generation method of the bias voltages $V_{BP1}$, $V_{BP2}$, $V_{BN1}$, and $V_{BN2}$ changes with the supply voltage.

3) As shown in FIG. 6, in the amplification phase $\Phi_{EN}$,

The energy-storage capacitor $C_{RES}$ powers a differential circuit, and the $V_{BP1}$, the $V_{BP2}$, the $V_{BN1}$, and the $V_{BN2}$ are bias voltages determined in the phase $\Phi_2$. Input signals $V_X$ and $V_Y$ are coupled to the amplification transistors (the PMOS transistor and the NMOS transistor) through the auto-zeroing capacitor $C_C$, and are amplified by the amplification transistors.

The above is a working procedure of the LVFIA throughout a complete cycle. In the above working procedure, the sub-1V power supply can be easily achieved, provided that a minimum power supply of the amplifier is greater than the $V_{gs}$.

The LVFIA can be applied to common analog integrated circuits, including but not limited to a switched capacitor ADC, a comparator, and the like. Owning to a working characteristic of the LVFIA, a circuit using the LVFIA can work at a lower supply voltage, thereby achieving a low power consumption.

A second embodiment of the present disclosure provides a switched capacitor ADC, including the LVFIA described in the first embodiment. The switched capacitor ADC may be a first-order multi-bit or multi-order N-bit $\Sigma\Delta$ ADC, where $N \geq 1$.

Figure 7:
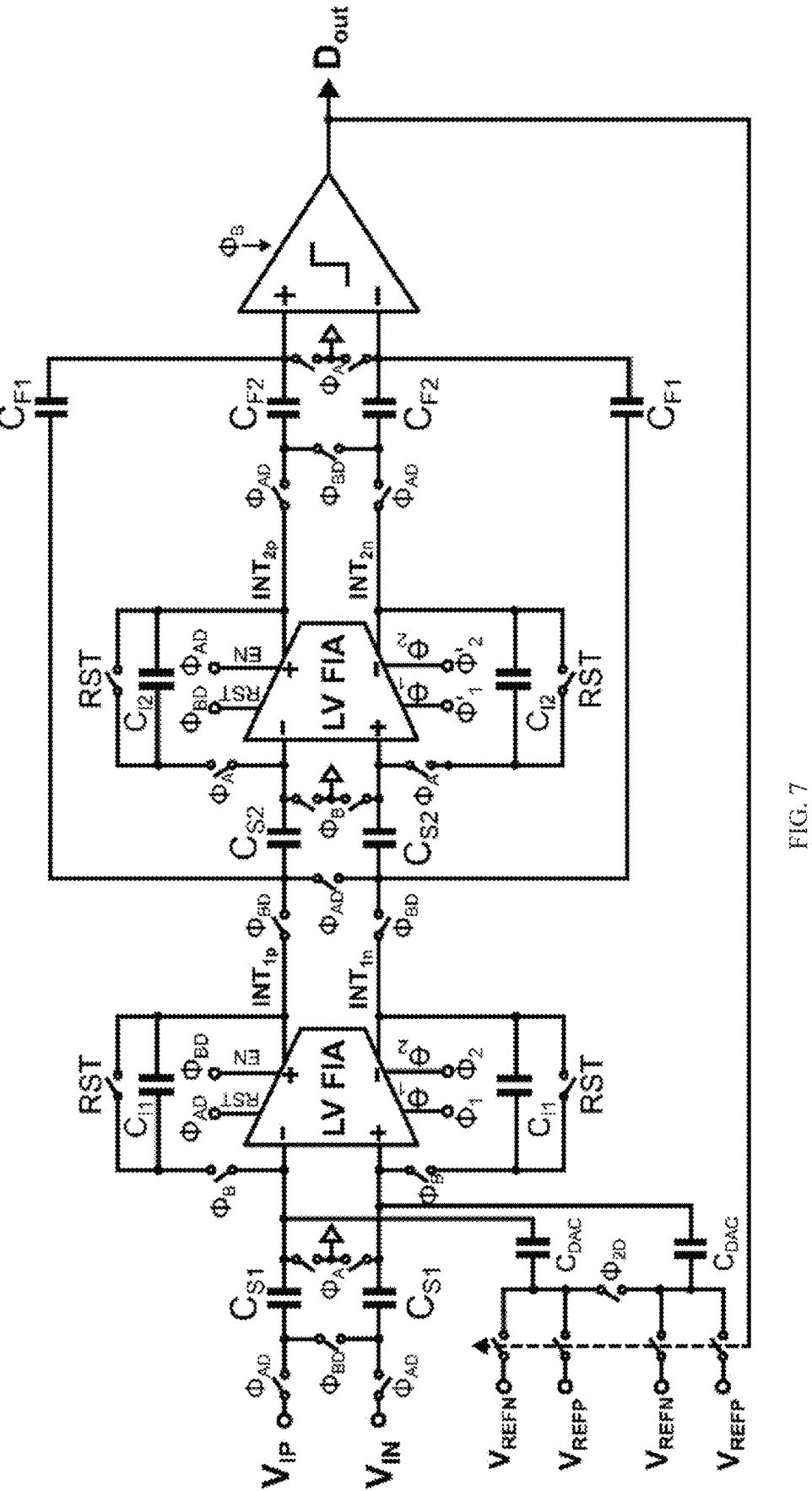
FIG. 7 is a schematic diagram of a circuit of a second-order one-bit $\Sigma\Delta$ modulator in a switched capacitor ADC according to an embodiment of the present disclosure.

The switched capacitor ADC is a $\Sigma\Delta$ ADC. The $\Sigma\Delta$ ADC includes a second-order one-bit $\Sigma\Delta$ modulator, and its circuit topology is shown in FIG. 7. The second-order one-bit EA modulator includes a first-stage integrator, a second-stage integrator, and a comparator, and both the first-stage integrator and the second-stage integrator include the LVFIA.

PA and OB are a pair of non-overlapping clocks of the second-order one-bit ZA modulator for controlling sampling and integration of the integrator, and are also input into the LVFIA as RST and EN clocks in the LVFIA. $\Phi_1$ and $\Phi_2$ are input into the LVFIA in the first-stage integrator as sub-clocks $\Phi_1$ and $\Phi_2$ of a reset phase of the LVFIA, which are respectively a capacitor charging phase and a bias voltage generation phase. $\Phi'_1$ and $\Phi'_2$ are input into the LVFIA in the second-stage integrator as sub-clocks $\Phi_1$ and $\Phi_2$ of a reset phase of the LVFIA, which are respectively a capacitor charging phase and a bias voltage generation phase.

Figure 8:
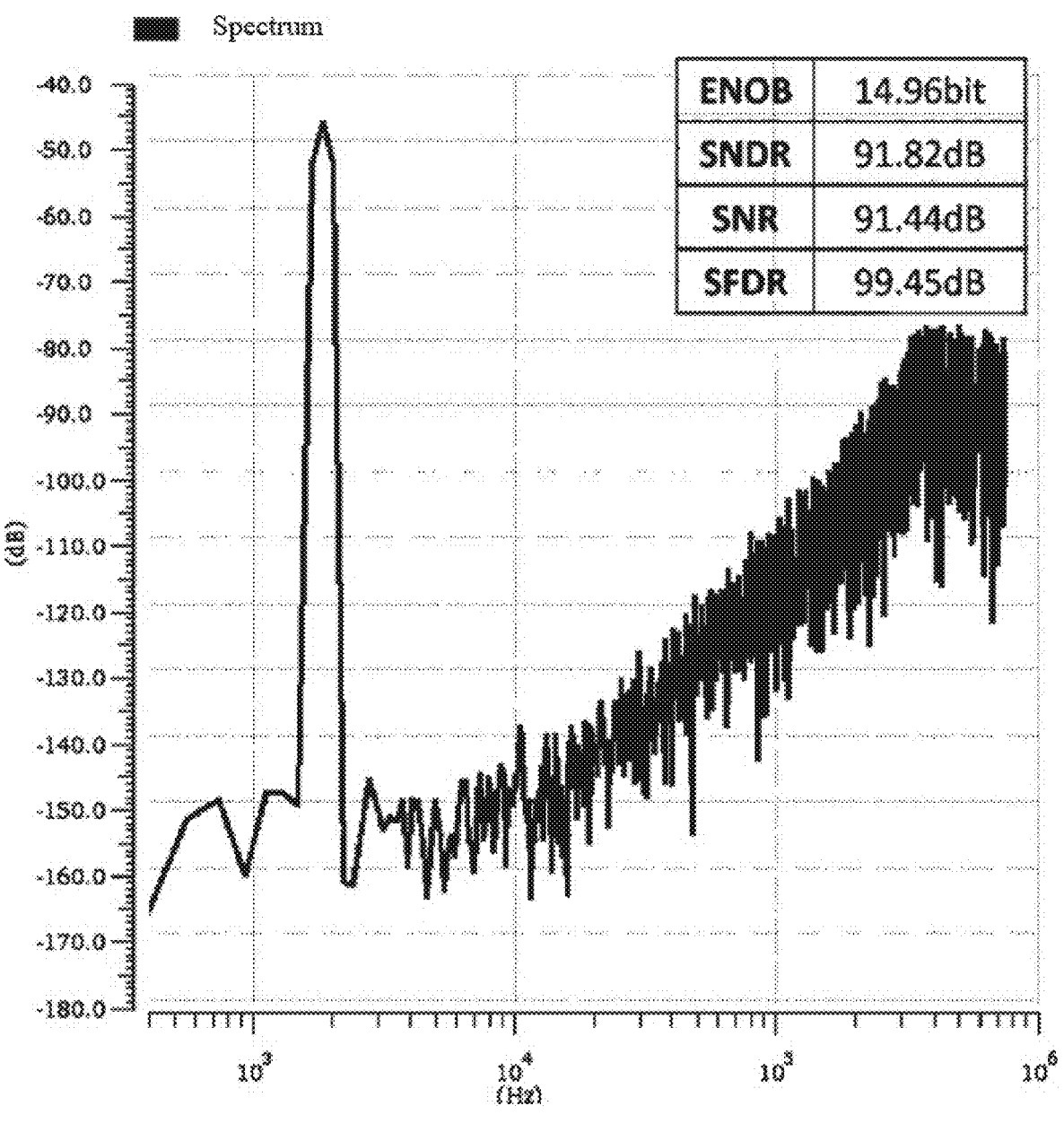
FIG. 8 is a schematic diagram of a post-simulated spectrogram of a second-order one-bit $\Sigma\Delta$ modulator in a switched capacitor ADC according to an embodiment of the present disclosure.

With the help of the above characteristic of the LVFIA, this modulator achieves a fully dynamic structure under 0.8V power supply, and a bandwidth and a power consumption can be linearly scaled with a sampling frequency. By default, the sampling frequency is 1.5 MHz, with an OSR of 200 and a corresponding input signal bandwidth of 3.75 kHz. Performance of this modulator is mainly limited by thermal noise, and this modulator can maximally achieve a 91.82 dB signal to noise and distortion ratio (SNDR), a 14.96-bit effective number of bits (ENOB), a 91.44 dB signal to noise ratio (SNR), and a 99.45 dB spurious free dynamic range (SFDR). A post-simulated spectrum of this modulator is shown in FIG. 8.

Finally, a post-simulated total power consumption of this modulator under the 0.8V power supply is 25.40 μA, and a 176.1 dB FoM$_{SNDR}$ value is achieved (FoM$_{SNDR}$ indicates an overall quality factor of the $\Sigma\Delta$ modulator). In a most advanced fully-dynamic $\Sigma\Delta$ modulator design, the present disclosure achieves optimal energy efficiency under a sub-1V power supply.

The present disclosure provides an LVFIA and a switched capacitor ADC, and there are many specific methods and approaches to achieve the technical solutions. The descriptions above are preferred implementations of the present disclosure. It should be noted that for a person of ordinary skill in the art, various improvements and modifications can be made without departing from the principles of the present disclosure. These improvements and modifications should also be regarded as falling into the protection scope of the present disclosure. The components that are not explicitly defined in the embodiments can be implemented according to the prior art.

The invention claimed is:

1. A low voltage floating inverter amplifier (LVFIA), comprising a first self-biased inverter, a second self-biased inverter, and an energy-storage capacitor $C_{RES}$, wherein both the first self-biased inverter and the second self-biased inverter are clock-controlled inverters capable of generating a bias voltage; and the first self-biased inverter, the second self-biased inverter, and the energy-storage capacitor $C_{RES}$ are connected in parallel, one end of the parallel connection is connected to a supply voltage $V_{DD}$ through a reset switch, and the other end of the parallel connection is connected to a grounding voltage $V_{SS}$ through a reset switch;

both an input terminal of the first self-biased inverter and an input terminal of the second self-biased inverter are connected to an input signal and to the grounding voltage $V_{SS}$ through a reset switch; both an output terminal of the first self-biased inverter and an output terminal of the second self-biased inverter are equipped with an amplification switch to control output of an output signal; and the reset switch and the amplification switch are alternately closed through clock control;

the first self-biased inverter comprises a capacitively-biased P-channel metal oxide semiconductor (PMOS) circuit and a capacitively-biased N-channel metal oxide semiconductor (NMOS) circuit, wherein the capacitively-biased PMOS circuit is connected to the supply voltage $V_{DD}$ through the reset switch, and the capacitively-biased NMOS circuit is connected to the grounding voltage $V_{SS}$ through the reset switch; one end of the capacitively-biased PMOS circuit is connected to one end of the capacitively-biased NMOS circuit, wherein a connection point is connected to an input voltage and to the grounding voltage $V_{SS}$ through the reset switch, and the other end of the capacitively-biased PMOS circuit is connected to the other end of the capacitively-biased NMOS circuit through the amplification switch; and the second self-biased inverter and the first self-biased inverter are mirrored;

the capacitively-biased PMOS circuit comprises a first auto-zeroing capacitor $C_{C1}$ and a PMOS transistor, wherein the first auto-zeroing capacitor $C_{C1}$ is connected to a gate of the PMOS transistor, with a connection point provided with a first charging switch and a first bias switch, the first charging switch is connected to the grounding voltage $V_{SS}$, and the first bias switch is connected to a drain of the PMOS transistor; a source of the PMOS transistor is connected to a source of a PMOS transistor of the second self-biased inverter, with a connection point separately connected to the energy-storage capacitor $C_{RES}$ and the reset switch; and the first charging switch and the first bias switch are alternately closed through the clock control;

the capacitively-biased NMOS circuit comprises a second auto-zeroing capacitor $C_{C2}$ and an NMOS transistor, wherein the second auto-zeroing capacitor $C_{C2}$ is connected to a gate of the NMOS transistor, with a connection point provided with a second charging switch and a second bias switch, the second charging switch is connected to the supply voltage $V_{DD}$, and the second bias switch is connected to a drain of the NMOS transistor; a source of the NMOS transistor is connected to a source of an NMOS transistor of the second self-biased inverter, with a connection point separately connected to the energy-storage capacitor $C_{RES}$ and the reset switch; and the second charging switch and the second bias switch are alternately closed through the clock control; and the first auto-zeroing capacitor $C_{C1}$ is connected to the second auto-zeroing capacitor $C_{C2}$, with a connection point connected to the input voltage and to the grounding voltage $V_{SS}$ through the reset switch; and the drain of the PMOS transistor and the drain of the NMOS transistor are connected through the amplification switch.

2. The LVFIA according to claim 1, wherein a clock control timing sequence comprises a reset phase $\Phi_{RST}$ and an amplification phase $\Phi_{EN}$, and the reset phase $\Phi_{RST}$ comprises a capacitor charging phase $\Phi_1$ and a bias voltage generation phase $\Phi_2$, wherein all reset switches are closed in the reset phase $\Phi_{RST}$ to form a path, and are opened in the amplification phase $\Phi_{EN}$; all charging switches are closed in the capacitor charging phase $\Phi_1$ to form a path, and are opened in other phases; all bias switches are closed in the bias voltage generation phase $\Phi_2$ to form a path, and opened in other phases; and all amplification switches are closed in the amplification phase $\Phi_{EN}$ to form a path, and opened in the reset phase $\Phi_{RST}$.

3. The LVFIA according to claim 2, wherein in the bias voltage generation phase $\Phi_2$, all auto-zeroing capacitors are discharged, and a target bias voltage is obtained by controlling high-level time in the bias voltage generation phase $\Phi_2$; and all PMOS transistors and NMOS transistors each achieve auto-zeroing to eliminate an offset voltage and 1/f noise.

4. The LVFIA according to claim 3, wherein in the bias voltage generation phase $\Phi_2$, a magnitude of a bias voltage generated by the discharging of all the auto-zeroing capacitors is related to the high-level time in the $\Phi_2$ and a capacitance value of the auto-zeroing capacitor, specifically, longer high-level time in the $\Phi_2$ leads to more electricity discharged by the auto-zeroing capacitor and a greater change of the generated bias voltage; and a larger capacitance value of the auto-zeroing capacitor leads to a slower change of the generated bias voltage.

5. A switched capacitor analog-to-digital converter (ADC), comprising the LVFIA according to claim 4.

6. The switched capacitor ADC according to claim 5, wherein the switched capacitor ADC is a ΣΔ ADC, the ΣΔ ADC comprises a second-order one-bit ΣΔ modulator, the second-order one-bit ΣΔ modulator comprises a first-stage integrator, a second-stage integrator, and a comparator, and both the first-stage integrator and the second-stage integrator comprise the LVFIA.

7. The switched capacitor ADC according to claim 6, wherein the second-order one-bit ΣΔ modulator comprises a pair of non-overlapping clocks $\Phi_A$ and $\Phi_B$, and the non-overlapping clocks $\Phi_A$ and $\Phi_B$ are configured to control sampling and integration of the first-stage integrator and the second-stage integrator, and are also input to the LVFIA as reset and amplification clocks in the LVFIA; the reset clock of the LVFIA in the first-stage integrator comprises sub-clocks $\Phi_1$ and $\Phi_2$ that are respectively a capacitor charging phase and a bias voltage generation phase; and the reset clock of the LVFIA in the second-stage integrator comprises sub-clock $\Phi'_1$ and $\Phi'_2$ that are respectively a capacitor charging phase and a bias voltage generation phase.

8. A switched capacitor analog-to-digital converter (ADC), comprising the LVFIA according to claim 3.

9. The switched capacitor ADC according to claim 8, wherein the switched capacitor ADC is a ΣΔ ADC, the ΣΔ ADC comprises a second-order one-bit ΣΔ modulator, the second-order one-bit ΣΔ modulator comprises a first-stage integrator, a second-stage integrator, and a comparator, and both the first-stage integrator and the second-stage integrator comprise the LVFIA.

10. The switched capacitor ADC according to claim 9, wherein the second-order one-bit ΣΔ modulator comprises a pair of non-overlapping clocks $\Phi_A$ and $\Phi_B$, and the non-overlapping clocks $\Phi_A$ and $\Phi_B$ are configured to control sampling and integration of the first-stage integrator and the second-stage integrator, and are also input to the LVFIA as reset and amplification clocks in the LVFIA; the reset clock of the LVFIA in the first-stage integrator comprises sub-clocks $\Phi_1$ and $\Phi_2$ that are respectively a capacitor charging phase and a bias voltage generation phase; and the reset clock of the LVFIA in the second-stage integrator comprises sub-clock $\Phi'_1$ and $\Phi'_2$ that are respectively a capacitor charging phase and a bias voltage generation phase.

11. A switched capacitor analog-to-digital converter (ADC), comprising the LVFIA according to claim 2.

12. The switched capacitor ADC according to claim 11, wherein the switched capacitor ADC is a ΣΔ ADC, the ΣΔ ADC comprises a second-order one-bit ΣΔ modulator, the second-order one-bit ΣΔ modulator comprises a first-stage integrator, a second-stage integrator, and a comparator, and both the first-stage integrator and the second-stage integrator comprise the LVFIA.

13. The switched capacitor ADC according to claim 12, wherein the second-order one-bit ΣΔ modulator comprises a pair of non-overlapping clocks PA and PB, and the non-overlapping clocks $\Phi_A$ and $\Phi_B$ are configured to control sampling and integration of the first-stage integrator and the second-stage integrator, and are also input to the LVFIA as reset and amplification clocks in the LVFIA; the reset clock of the LVFIA in the first-stage integrator comprises sub-clocks $\Phi_1$ and $\Phi_2$ that are respectively a capacitor charging phase and a bias voltage generation phase; and the reset clock of the LVFIA in the second-stage integrator comprises sub-clock $\Phi'_1$ and $\Phi'_2$ that are respectively a capacitor charging phase and a bias voltage generation phase.

14. A switched capacitor analog-to-digital converter (ADC), comprising the LVFIA according to claim 1.

15. The switched capacitor ADC according to claim 14, wherein the switched capacitor ADC is a $\Sigma\Delta$ ADC, the $\Sigma\Delta$ ADC comprises a second-order one-bit $\Sigma\Delta$ modulator, the second-order one-bit $\Sigma\Delta$ modulator comprises a first-stage integrator, a second-stage integrator, and a comparator, and both the first-stage integrator and the second-stage integrator comprise the LVFIA.

16. The switched capacitor ADC according to claim 15, wherein the second-order one-bit $\Sigma\Delta$ modulator comprises a pair of non-overlapping clocks $\Phi_A$ and $\Phi_B$, and the non-overlapping clocks $\Phi_A$ and $\Phi_B$ are configured to control sampling and integration of the first-stage integrator and the second-stage integrator, and are also input to the LVFIA as reset and amplification clocks in the LVFIA; the reset clock of the LVFIA in the first-stage integrator comprises sub-clocks $\Phi_1$ and $\Phi_2$ that are respectively a capacitor charging phase and a bias voltage generation phase; and the reset clock of the LVFIA in the second-stage integrator comprises sub-clock $\Phi'_1$ and $\Phi'_2$ that are respectively a capacitor charging phase and a bias voltage generation phase.

* * * * *